(12) United States Patent
Chang (10) Patent No.: US 7,052,321 B2
(45) Date of Patent: May 30, 2006

(54) ASSEMBLY STRUCTURE FOR A CONNECTOR

(75) Inventor: Che-Chia Chang, Taipei Hsien (TW)

(73) Assignee: Comax Technology Inc., Taipei Hsien (TW)

(*) Notice: Subject to any disclaimer, the term of this patent is extended or adjusted under 35 U.S.C. 154(b) by 0 days.

(21) Appl. No.: 10/965,884

(22) Filed: Oct. 18, 2004

(65) Prior Publication Data
US 2006/0084319 A1 Apr. 20, 2006

(51) Int. Cl.
*H01R 13/648* (2006.01)
(52) U.S. Cl. ........................... 439/607; 439/608
(58) Field of Classification Search ............... 439/607, 439/608, 540.1, 541.5, 941
See application file for complete search history.

(56) References Cited

U.S. PATENT DOCUMENTS

| | | | |
|---|---|---|---|
| 6,139,367 A * | 10/2000 | Yeh | 439/609 |
| 6,165,014 A * | 12/2000 | Kao et al. | 439/607 |
| 6,364,707 B1 * | 4/2002 | Wang | 439/607 |
| 6,837,720 B1 * | 1/2005 | Hicks et al. | 439/79 |
| 6,840,817 B1 * | 1/2005 | Chen | 439/676 |
| 2001/0049227 A1 * | 12/2001 | Zhu et al. | 439/607 |

* cited by examiner

*Primary Examiner*—Tho D. Ta
(74) *Attorney, Agent, or Firm*—Troxell Law Office, PLLC (57) ABSTRACT

The present invention is related to an assembly structure for a high frequency connector, which is mainly formed by two interior connectors stacked, wherein each connector is connected between the transmission conductive paths of a printed circuit board and separated to form a conductive shielding layer, wherein the printed circuit board comprises at least four layers, the top and bottom surface, two connectors and a controller form a first transmission path and a second transmission path, and forms a grounding layer in an intermediate layer of the printed circuit board to shield the first transmission path and the second transmission path, thereby preventing the interference from when two connectors simultaneously transmit high frequency signal so that makes the layout of the circuit more easier and can improve the high frequency impedance and its relative variables.

20 Claims, 8 Drawing Sheets

ASSEMBLY STRUCTURE FOR A CONNECTOR

BACKGROUND OF THE INVENTION

1. Field of the Invention

The present invention relates to an assembly structure for a connector and, more particularly, relates to an assembly structure with two stacked connectors which is suitable used in 3 GHz~6 GHz high frequency transmission.

2. Description of the Related Art

In general, the connector design at present, for concerning to reduce the positioned space on the motherboard, most connectors of the market use the stacked design to increase the plane elements capacity of the motherboard; For example, the U.S. Pat. No. 5,800,207 patent, which is relative to an assembly structure to a connector. But the connector structure of the U.S. Pat. No. 5,800,207 patent just stacks the connectors, it does not has a metal shielding shell molded as a whole, so it can not improve the whole shielding effect after stacking the connectors, namely, the electromagnetic interference (EMI) will be generated due to the noises between the two connectors can not be suitable eliminated, thus it will generate the bad influence to the transmission quality.

Additionally, the U.S. Pat. No. 5,037,330 patent discloses a shielded, stacked electrical connector assembly comprising an upper electrical connector and a lower electrical connector having respective insulating housings, wherein, the upper electrical connector and a lower electrical connector are stacked inside the insulating housings and then a metal shell is covered over the insulating housings, thus making the electrical connector assembly has certain ability of electromagnetic shielding effect; however, the conductive terminal of the aforesaid two connector must be soldered between the conductive surfaces of the printed circuit board, and for matching the requirement of the high frequency transmission, the transmission lines placed on the surfaces must has relative design corresponding to the high frequency characteristic (such as high frequency impedance match); however, it will generate mutually interference that it will further affects the transmission quality when the two connectors simultaneously transmit high frequency signal.

Additionally, the differential high frequency impedance design, its placement consists of one or more pairs of transmission signals ($S_+, S_-$), wherein, it further comprises a Signal ground and Chassis ground placed between pairs of transmission signals or other signals for separating, so as to prevent generating from interference and avoid other signals interfering the transmission signals ($S_+, S_-$). The distance between the transmission signals ($S_+, S_-$) is one of the key parameters that affects the high frequency impedance. Therefore, besides each transmission line has been insulated thus will increase the placement density, the line pitch, line width and line thickness between the two connectors and the controller must either be matched. Furthermore, the adjacent transmission lines of the two connectors also generates mutual inductance and mutual capacitor to form crosstalk interference phenomenon, and the phenomenon will be gotten seriously while the placement density of the printed circuit board being increased, especially, for long distance placement density of the printed circuit board (such as: BUS), thus will increase the difficultly for circuit designing.

Therefore, there needs an assembly structure with two stacked connectors which is suitable used in 3 GHz~6 GHz high frequency transmission and overcomes the aforesaid drawbacks of the prior art.

SUMMARY OF THE INVENTION

The present invention has been accomplished under the circumstances in view. It is therefore the main object of the present invention to provide an assembly structure for a connector, which can avoid the mutual interference while two connectors are simultaneously transmitting high frequency signals so as to eliminate the aforesaid drawbacks.

It is therefore the second object of the present invention to provide an assembly structure for a connector with simply layout, which can effectively improve the high frequency impedance and its relative variables so as to eliminate the aforesaid drawbacks.

It is therefore still an object of the present invention to provide an assembly structure for a connector, which has well electromagnetic shielding effect between the transmission signals of two connectors.

It is therefore still an object of the present invention to provide an assembly structure for a connector with simply assembly.

It is therefore still an object of the present invention to provide an assembly structure for a connector, which has high stability design.

According to one aspect of the present invention, the first object of the present invention is to provide an assembly structure for a connector. Particularly, the assembly structure for a connector which is mainly formed by two interior stacked connectors, wherein each connector is connected between the transmission conductive paths of a printed circuit board and separated to form a conductive shielding layer, wherein the printed circuit board comprises at least four layers, the top and bottom surface, two connectors and a controller to form a first transmission path and a second transmission path, and forms a grounding layer in an intermediate layer of the printed circuit board to shield the first transmission path and the second transmission path.

Wherein the housing further comprises a first inserting portion and a second inserting portion for containing the two connectors, and the first inserting portion and the second inserting portion further comprises a slot, respectively.

Wherein the first conductive terminal of first connector and the second conductive terminal of second connector are respectively connected to the separated transmission paths of the printed circuit board.

Wherein the printed circuit board further comprises an intermediate layer to shield the first transmission path and the second transmission path between the two surfaces of the printed circuit board.

Wherein the intermediate layer of the printed circuit board can be connected to the signal ground of the transmission path.

Wherein the intermediate layer of the printed circuit board can be insulated to the signal ground of the transmission path.

Wherein the conductive shielding layer further comprises a first shelter and a second shelter.

Wherein the first shelter is formed by bending at opposite direction, so as to form a first elasticity fastener located inside the fixing pillar.

Wherein the first shelter further outwardly extends to form a second elasticity fastener corresponding to the first inserting portion and the second inserting portion, respectively, thereby fixing and fastening the connectors.

Wherein the second shelter is used to shield the first inserting portion from horizontal direction and being vertically downwardly bent to the ground terminal of the printed circuit board, and the bottom portion of the second shelter further comprises a grounding terminal.

Wherein the present invention further comprises an insulated conductive portion, and the insulated conductive portion further comprises a pair of symmetrical holes located at the central portion corresponding to the grounding terminal, and respectively forms a first guiding conductive region and a second conductive region toward to both sides of the central portion, so as to provide the first conductive terminal and the second conductive terminal being inserted into, respectively.

Wherein the insulated conductive portion is located at the frame corresponding to the bottom of a vertical bent of the second shelter.

Wherein the guiding conductive region can be a plurality of separate cavities.

Wherein the guiding conductive region can be a plurality of grooves.

Wherein the present invention further comprises a conductive shell covered over the frame for forming a chassis ground, wherein the conductive shell further comprises a third elasticity fastener located in horizontal direction, and the frame comprises a second slot corresponding to the third elasticity fastener, the conductive shell further comprises a fourth elasticity fastener located in vertical direction.

Wherein the first conductive terminal, the second conductive terminal and the shelter of the conductive shielding layer are parallel.

Wherein the conductive shielding layer is made by molding as a whole method.

These and other features, aspects, and advantages of the present invention will become apparent by a review of the following detailed description of the preferred embodiment of the invention and by reference to the following drawings.

DETAILED DESCRIPTION OF THE PREFERRED EMBODIMENT

Figure 1:
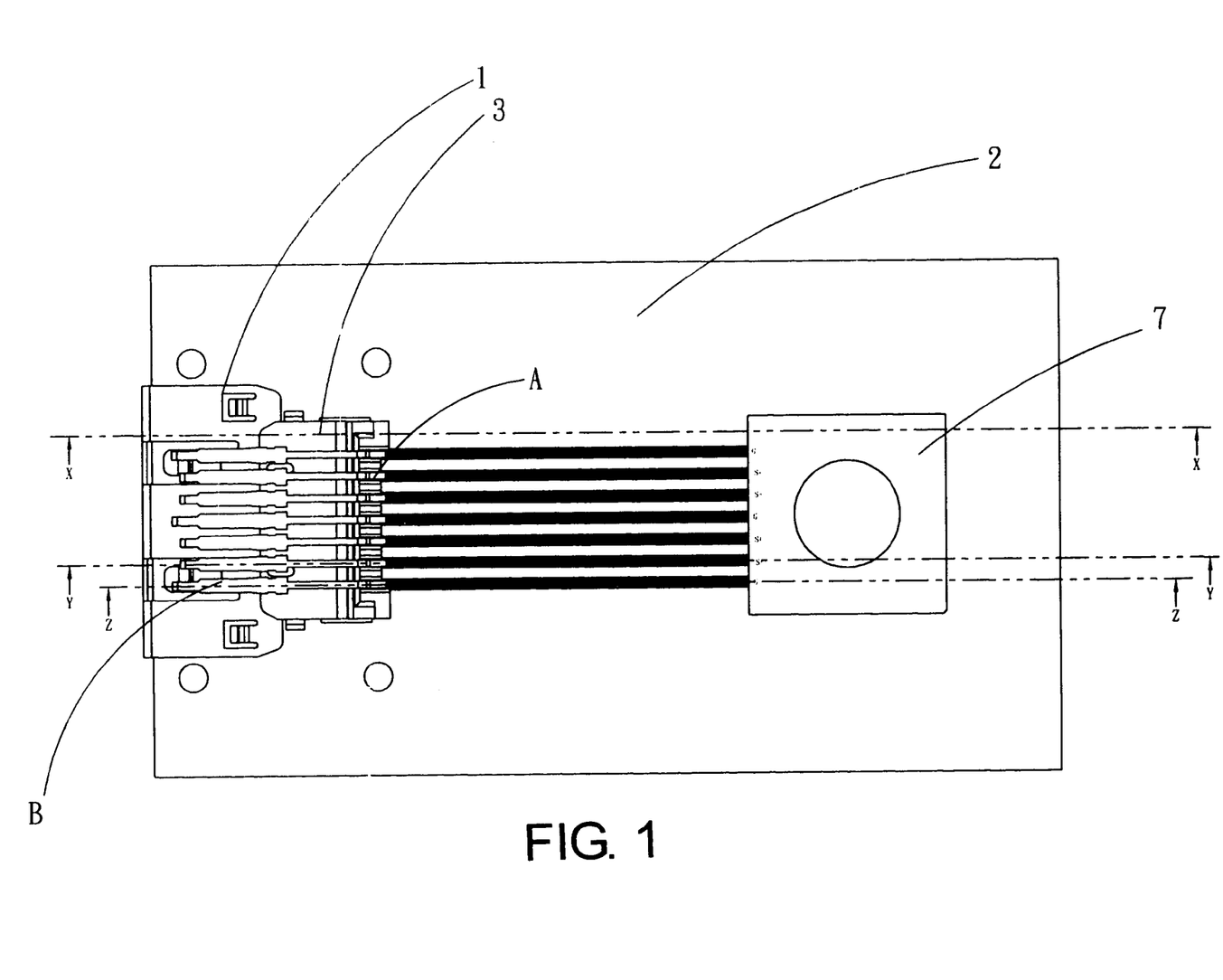
FIG. 1 illustrates a top view showing the connector connecting to the controller on the printed circuit board according to one prefer embodiment of the present invention.
Figure 2:
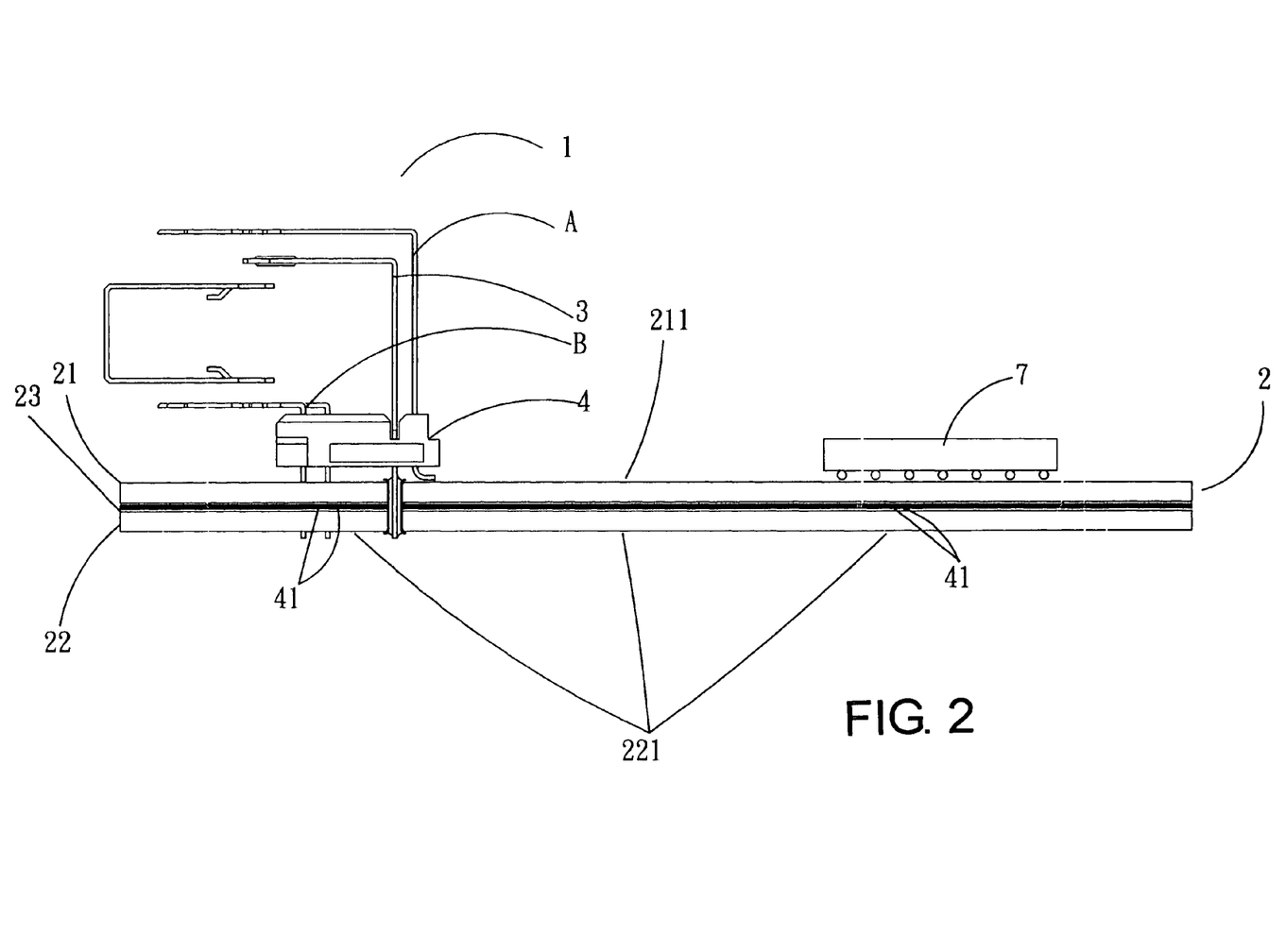
FIG. 2 illustrates a X—X direction sectional view showing the conductive shielding layer and the printed circuit board connecting to the Chassis ground according to one prefer embodiment of the present invention.

Referring to FIGS. 1 and 2, which respectively illustrates a top view and a X—X direction sectional view showing of the connector of the present invention according to one prefer embodiment of the present invention. As shown in the Figs., the assembly structure for a connector of the present invention comprises: a frame 1, having a first inserting portion 12 and a second inserting portion 13 that are vertically separately each other, and the first inserting portion 12 having a first conductive terminal A, as well as the second inserting portion 13 having a second conductive terminal B, wherein the grounding terminals (G) are mainly separately arranged between the two ends of the signal terminal pair ($S_+$, $S_-$); at least one electronic element 7, having a grounding terminals 71, 72 and signal terminals 73, 74 arranged in sequence; and a printed circuit board (PCB) 2, having at least one first surface layer 21, a second surface layer 22 and an intermediate layer 23, and the intermediate layer 23 being insulated with the first surface layer 21 and second surface layer 22, respectively; wherein the first conductive terminal A and the second conductive terminal B are both connected to the transmission paths of the printed circuit board 2 to form a conductive shielding layer 3 by separating, thereby forming a ground shielding for insulating the first conductive terminal A and the second conductive terminal B between the intermediate layer 23 of the printed circuit board 2 and the conductive shielding layer 3, and then forming the Chassis grounding with the external housing (please refer to FIG. 1).

Figure 3:
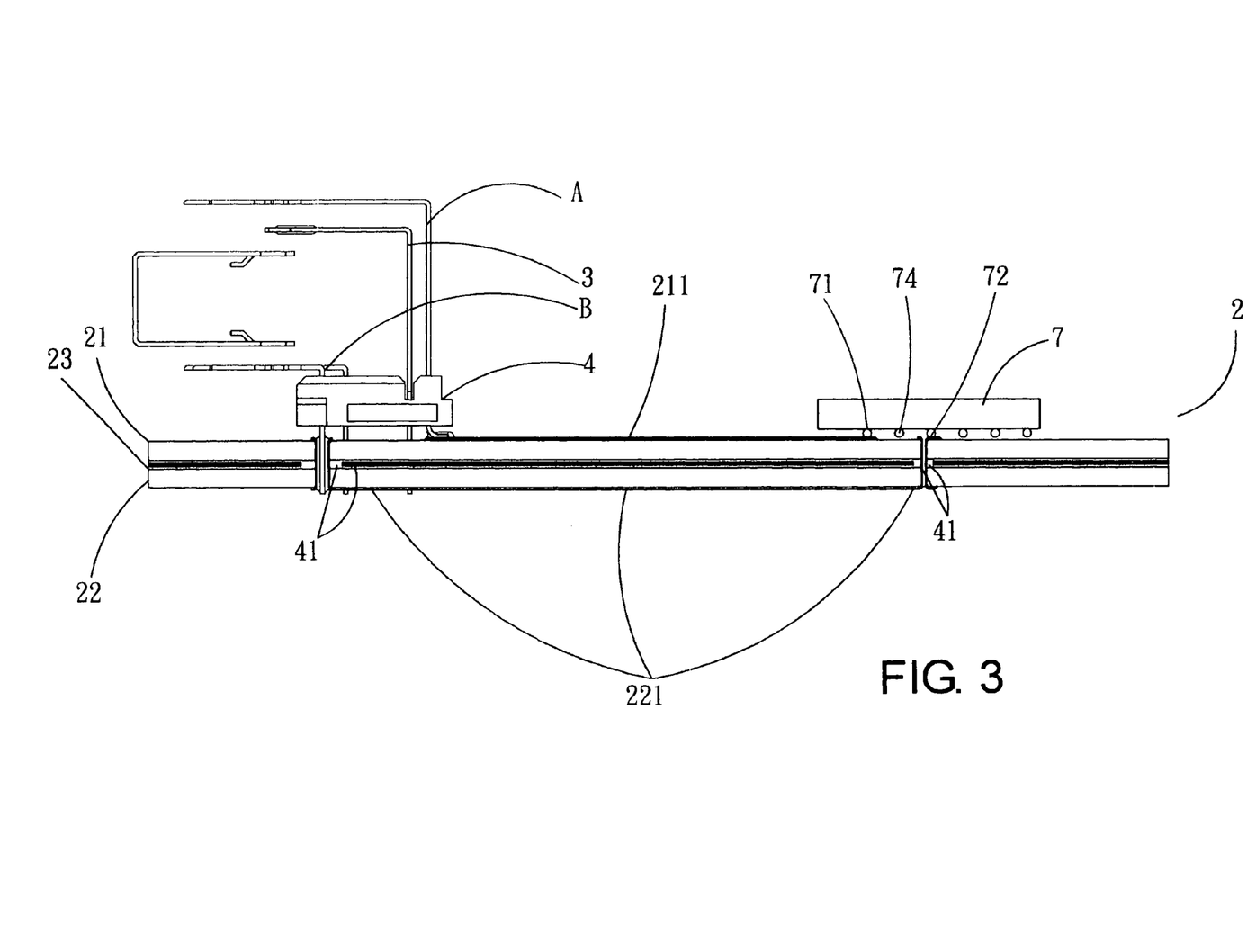
FIG. 3 illustrates a Y—Y direction sectional view showing the connector of the present invention and the printed circuit board connecting to the Signal ground according to one prefer embodiment of the present invention.
Figure 4:
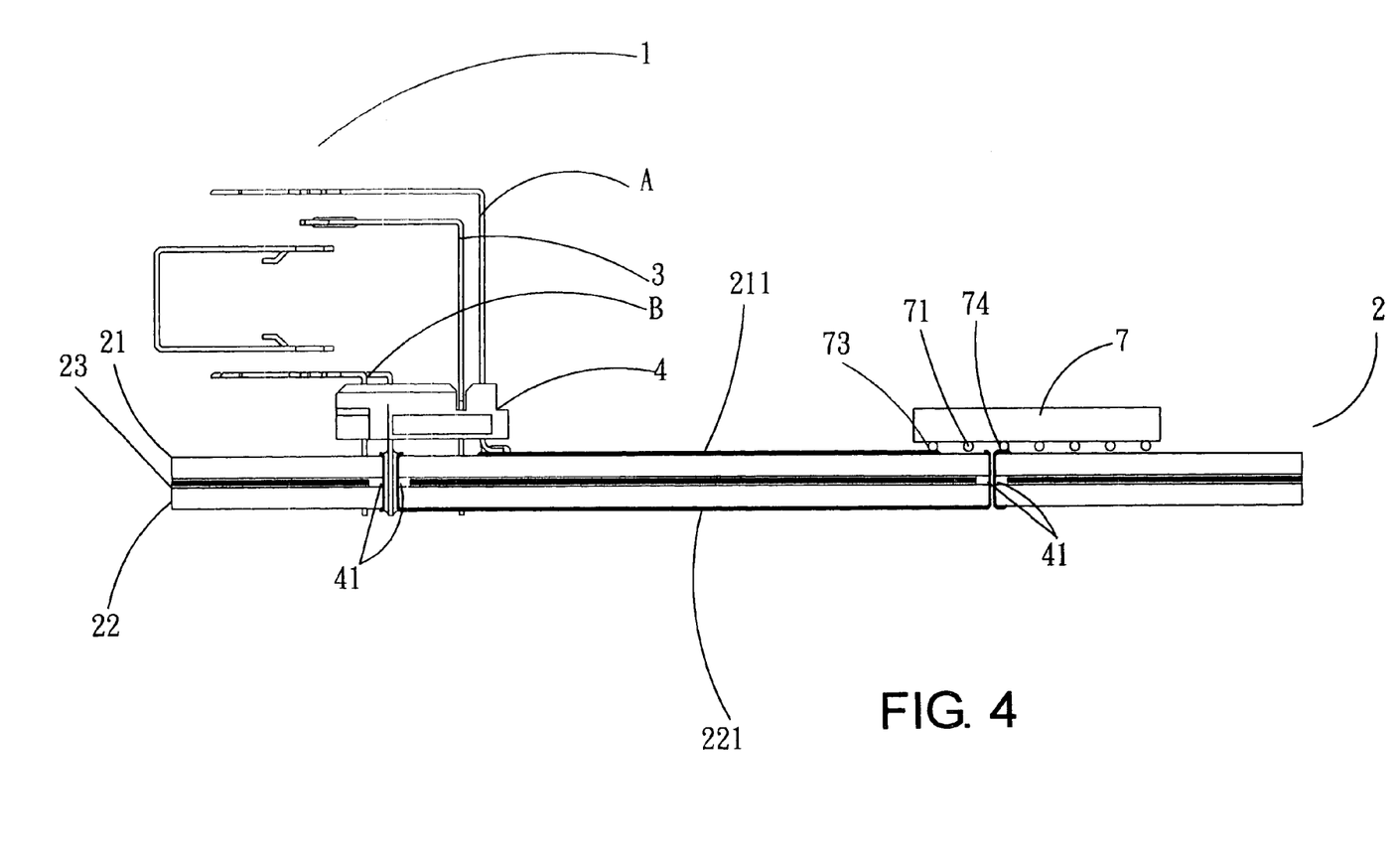
FIG. 4 illustrates a Z—Z direction sectional view showing the signal transmission between the connector of the present invention and the printed circuit board according to one prefer embodiment of the present invention.

Referring to FIGS. 3 and 4, which respectively illustrates Y—Y and Z—Z direction sectional views showing the connector of the present invention and the printed circuit board connecting to the signal ground according to one prefer embodiment of the present invention. As shown in the Figs., it will mutually form a first transmission path 211 after the controller 7 and the first conductive terminal A of the first connector connecting to the first surface layer 21; and it will mutually form a second transmission path 221 after the controller 7 and the second conductive terminal B of the second connector insulating the intermediate layer 23 of the printed circuit board 2 both by passing through the hole 41; wherein, the grounding terminals (G) of the first conductive terminal A and the second conductive terminal B are connected to the grounding terminals 71, 72 of the controller 7 to respectively form signal ground by the first transmission path 211 and second transmission path 221 (please refer to FIG. 3); the signal terminal pair ($S_+$, $S_-$) of the first conductive terminal A and the second conductive terminal B are respectively connected to the signal terminals 73, 74 of the controller 7 to form signal transmission by the first transmission path 211 and second transmission path 221 (please refer to FIG. 4). Wherein, the Chassis ground formed by the intermediate layer 23 can be chosen to connect to the signal terminals 73, 74 or insulated according to the user's requirement.

By using the aforesaid structure, even the first transmission path 211 and the second transmission path 221 keeping parallel to transmit signals, the connector structure of the present invention can prevent generating from mutual interference when two connectors are simultaneously transmitting high frequency signals, so as to simplify the circuit layout design.

Figure 5:
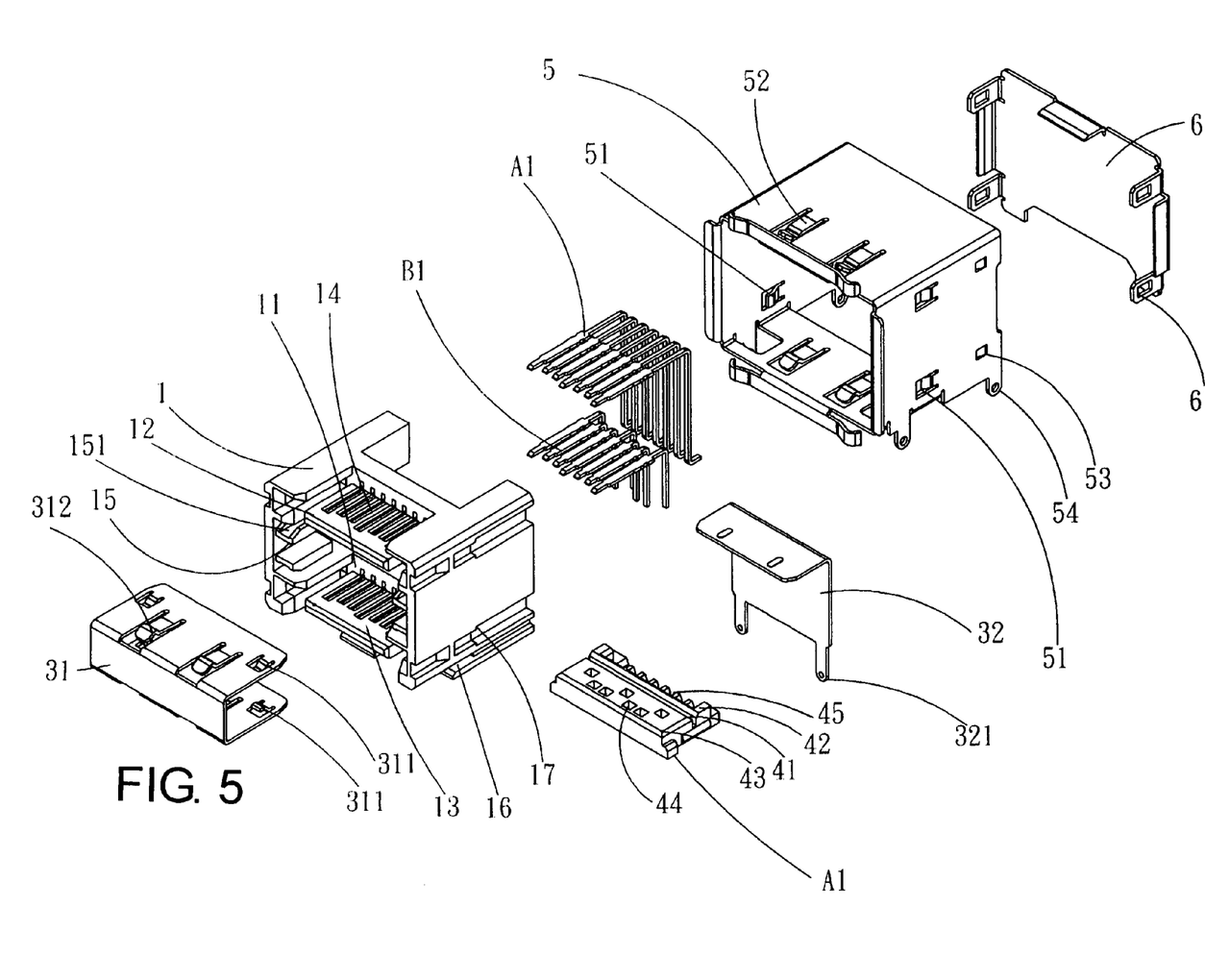
FIG. 5 illustrates a disassembly view showing the disassembly view of the connector according to one prefer embodiment of the present invention.
Figure 6:
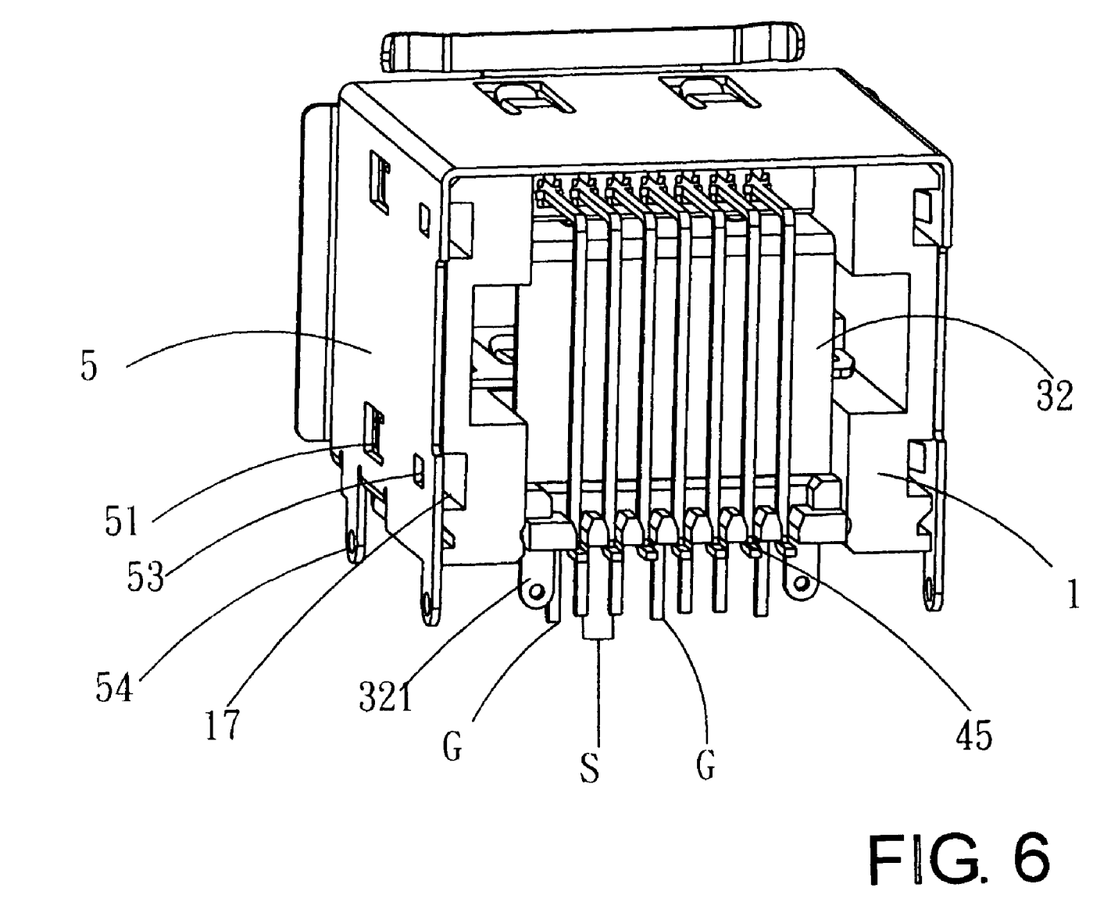
FIG. 6 illustrates a partial assembly rear view of the connector according to the prefer embodiment of the present invention.
Figure 7:
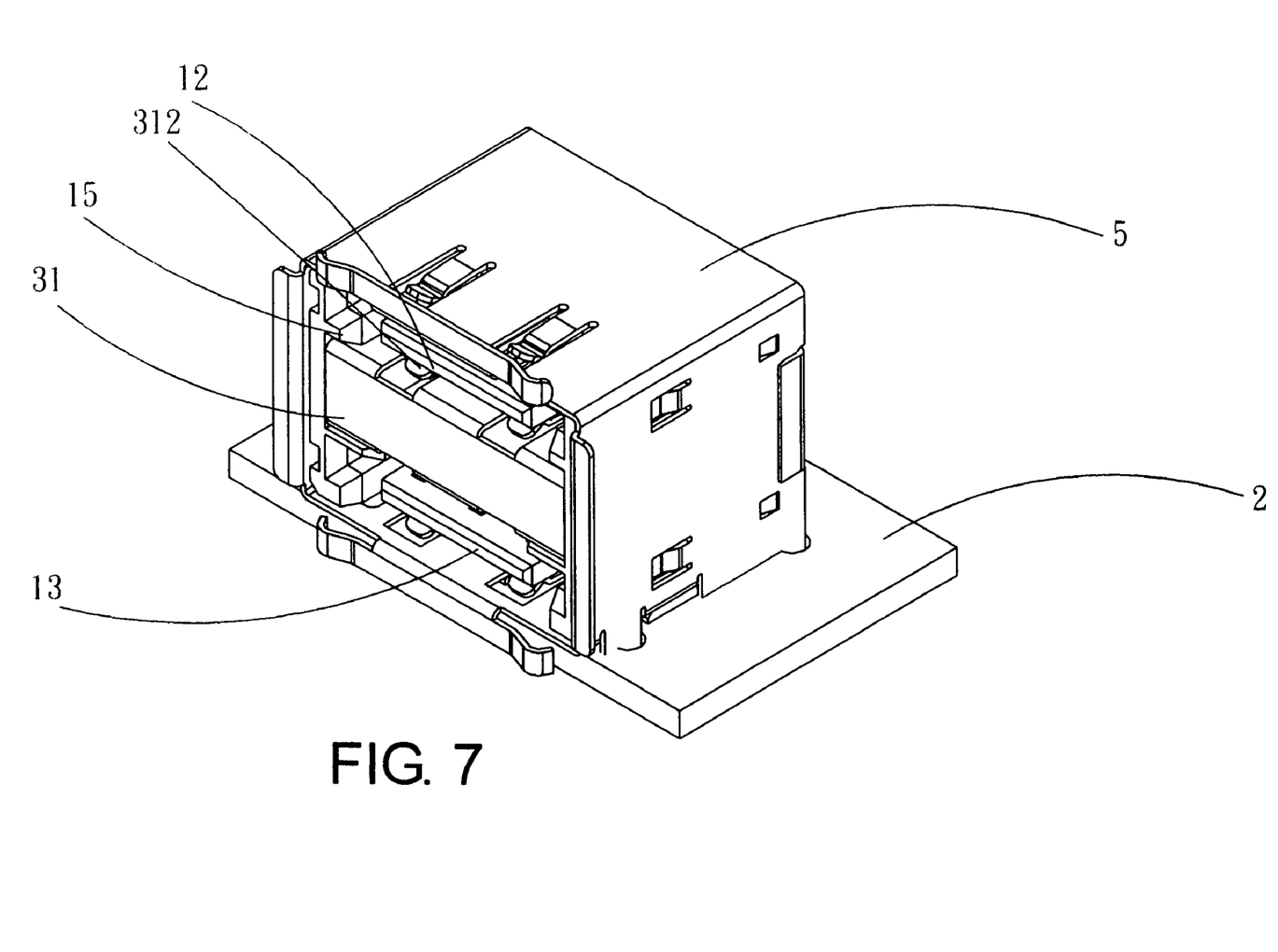
FIG. 7 illustrates an appearance view of the connector after assembling according to the prefer embodiment of the present invention.
Figure 8:
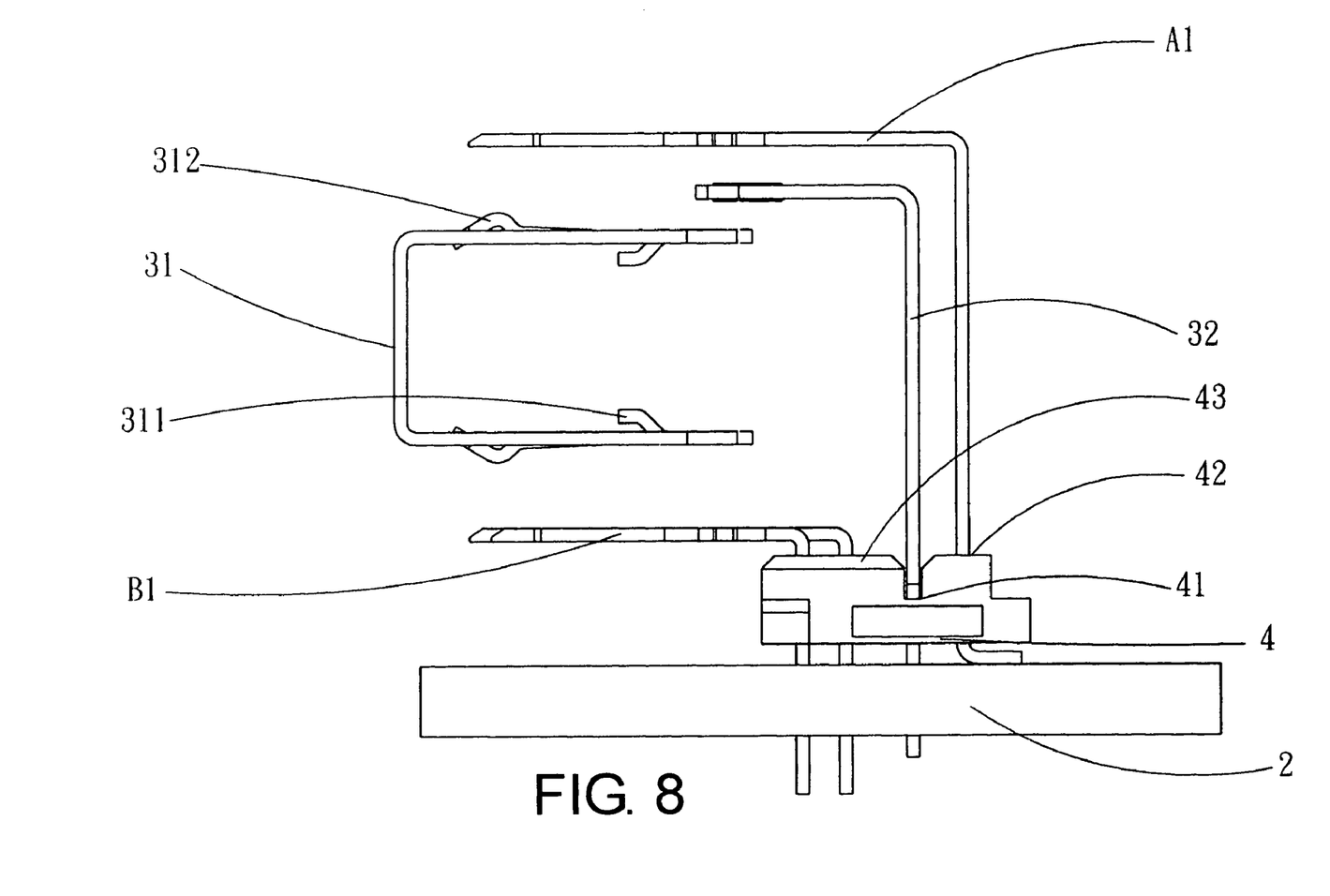
FIG. 8 illustrates an internal view between the connector and the printed circuit board after assembling according to the prefer embodiment of the present invention.

Referring to FIGS. 5, 6 and 7, as shown in the Figs., the assembly structure for a connector according to one prefer embodiment of the present invention mainly comprises: a frame 1, having a separate room for respectively containing the first connector and second connector that are mutually stacked (figure not shown), and having a first conductive terminal A and a second conductive terminal B inside the frame 1 corresponding to the first connector and second connector; conductive shielding layer 3, for shielding the internal separately transmission path and connecting to the chassis ground; an insulated conductive portion 4, for respectively separately connecting the first conductive terminal A and second conductive terminal B to a first surface layer 21, a second surface layer 22 and an intermediate layer 23 of the printed circuit board 2; and a conductive shell 5, for covering over the frame 1 to form an external conductive shielding.

Wherein, the frame 1 has a first inserting portion 12 and a second inserting portion 13 therein that are vertically separately each other, and the first inserting portion 12 and second inserting portion 13 further comprise slots 14 for containing the grounding terminal (G) and signal terminal pair ($S_+$, $S_-$) of the first conductive terminal A and second conductive terminal B and then provides the first connector and the second connector being inserted into, respectively.

The conductive shielding layer 3 further comprises a first shelter 31 and a second shelter 32, wherein, the first shelter 31 is used for shielding the first inserting portion 12 and the second inserting portion 13 and is vertical downwardly bent in an opposite position for forming a first elasticity fastener 311, and a fixing pillar 15 is positioned between the first inserting portion 12 and the second inserting portion 13 corresponding to the first elasticity fastener 311, and the fixing pillar 15 has a first slot 151 toward to the first elasticity fastener 311 for making the first elasticity fastener 311 be inserted therein so as to provide the first shelter 31 being fastened inside the fixing pillar 15 of the frame 1; as well as the first shelter 31 further respectively outwardly extends a second elasticity fastener 312 corresponding to the first inserting portion 12 and the second inserting portion 13, thereby respectively fixing and locating the connectors; the second shelter 32 is used for shielding the first inserting portion 31 from horizontal direction and vertical downwardly bent to extend to the printed circuit board 2, and it further comprises grounding terminals 321 located at its bottom portion for connecting to the intermediate layer 23 of the printed circuit board 2.

The insulated conductive portion 4 is located at the frame 1 corresponding to the bottom portion of a vertical bent of the second shelter 32, and it further comprises a pair of symmetrical holes 41 located at the central portion corresponding to the grounding terminal 321, and respectively forms a first guiding conductive region 42 and a second guiding conductive region 43 toward to both sides of the central portion, wherein the first guiding conductive region 42 and the second guiding conductive region 43 are formed a plurality of separate cavities or grooves 45 so as to respectively provide the first conductive terminal A and the second conductive terminal B being inserted into and the conductive terminal A and second conductive terminal B can be arranged according to the different requirements, such as in the SATA interface, the conductive terminal A and second conductive terminal B are formed grounding channels at both sides of the signal channel by arranging parallel in pairs.

Referring to FIG. 5, which illustrates a disassembly view showing the disassembly view of the connector according to one prefer embodiment of the present invention. As shown in the Fig., the second shelter 32 is inserted at the central portion of the insulated conductive portion 4, and the conductive terminal A and second conductive terminal B is respectively inserted corresponding to the both sides of the second shelter 32, thus making the conductive shielding layer 3 formed by the second shelter 32 matching up the first shelter 31 completely shields the conductive terminal A and second conductive terminal B and extends to the transmission paths of the printed circuit board 2, and then covering by a conductive shell 5 and shielding the rear portion of the conductive terminal A by a back plate 6, such that the conductive terminal A can directly connect to the first terminal 71 of the controller 7 via the first surface layer 21 of the printed circuit board 2 to form the first transmission path 211 (please refer to FIG. 1); and the conductive terminal B can directly connect to the second terminal 72 of the controller 7 via the second surface layer 22 of the printed circuit board 2 to form the second transmission path 221; the second shelter 32 of the conductive layer 3 is directly connected to the intermediate layer 23 for grounding, namely, the first transmission path 211 and the second transmission path 221 is respectively parallel to the grounding layer of the intermediate layer 23, such that the high frequency signal between them can effectively form coupling match so as to shorten the layout area between the electronic elements 7 and simplify the layout design of the printed circuit board 2.

Additionally, the conductive shell 5 further comprises a third elasticity fastener 51 located in horizontal direction and a fourth elasticity fastener 52 located in vertical direction, and the frame 1 comprises a supporting bottom groove 16 and a second slot 17 corresponding to the third elasticity fastener 51, such that the frame 1 can be covered and fastened inside the conductive shell 5 by the supporting bottom groove 16 and second slot 17; the bottom portion of conductive shell 5 also comprises grounding terminals 54 inserted into the printed circuit board 2 to form Chassis ground, additionally, the fourth elasticity fastener 52 and the second elasticity fastener 312 of the first shelter 31 of conductive shielding layer 3 respectively generates a clipping force in an opposite direction to the first connector and second connector so as to effectively increase the stability.

Additionally, the back plate 6 further comprises a fastening portion 61, and has a fifth elasticity fastener 53 located in the conductive shell 5 corresponding to the fastening portion 61, such that the fastening portion 61 of the back plate 6 can be passed through the second slot 17 of the frame 1 (please refer to FIG. 5) and then fastened with the fifth elasticity fastener 53, so as to let the back plate 6 be located between the conductive shell 5 and the frame 1.

Furthermore, the first shelter 31 and the second shelter 32 can be made by molding as a whole method (not shown), namely, the first conductive terminal A1 and second conductive terminal B1 can keep parallel to the conductive shielding layer 3, thereby effectively reducing the electromagnetic interference, so as to maintain the transmission quality. If the connector structure needs to be disassembled, it only needs to press the elasticity fastener and then the connectors, conductive shielding layer, conductive shell and the back plate will be separated each other, thereby simplifying to disassemble the connector structure.

Although particular embodiments of the invention have been described in detail for purposes of illustration, various modifications and enhancements may be made without departing from the spirit and scope of the invention. Accordingly, the invention is not to be limited except as by the appended claims.

The invention claimed is:

1. An assembly structure for a connector comprising:
a frame, having a first inserting portion and a second inserting portion that are vertically separately each other, said first inserting portion having a plurality of first conductive terminals, and said second inserting portion having a plurality of second conductive terminals;
a printed circuit board, having a first surface and a second surface that are respectively formed on both sides thereof, and forming a chassis ground in an intermediate layer between the first surface and the second surface;
a conductive shielding layer shielded to between said first conductive terminals and second conductive terminals; and
an insulated portion, comprising a pair of symmetrical holes located at the central portion, a first guiding conductive region and a second conductive region toward to both sides of said central portion, respectively, so as to provide said first conductive terminals extending through said first conductive region and said second conductive terminals extending through said second conductive region, respectively.

2. The assembly structure for a connector as claimed in claim 1, wherein said insulated portion is located at said frame corresponding to the bottom of a vertical bent of said conductive layer, and said guiding conductive region is a plurality of separate cavities or grooves.

3. The assembly structure according to claim 1, wherein the frame includes a supporting bottom groove.

4. The assembly structure according to claim 1, wherein the conductive shielding layer includes a first shelter and a second shelter.

5. The assembly structure according to claim 4, wherein the first shelter is located in the frame between the first end of the first conductive terminals and the first end of the second conductive terminals.

6. The assembly structure according to claim 4, wherein the second shelter is located in the insulated portion between the second end of the first conductive terminals and the second end of the second conductive terminals.

7. The assembly structure according to claim 4, wherein the second shelter having two grounding terminals, one of the two grounding terminals is inserted into each two holes of the insulated portion.

8. The assembly structure according to claim 1, further comprising a conductive shell surrounding the frame.

9. The assembly structure according to claim 8, further comprising a back plate connected to the conductive shell.

10. An assembly structure for a connector comprising:
a) a printed circuit board having:
   i) a first transmission path located on a first surface thereof;
   ii) a second transmission path located on a second surface thereof; and
   iii) an intermediate layer located between the first surface and the second surface;
b) a controller connected to the first surface of the printed circuit board;
c) a frame spaced apart from the controller and having:
   i) a first inserting portion;
   ii) a second inserting portion located parallel and spaced apart from the first inserting portion;
   iii) a first conductive terminal having a first end inserted into the first inserting portion; and
   iv) a second conductive terminal having a first end inserted into the second inserting portion;
d) a conductive shielding layer shielding the first conductive terminal and the second conductive terminal; and
e) an insulated portion located in the frame and connected to the first surface of the printed circuit board, a second end of the first conductive terminal extending through the insulated portion and being electrically connected to the controller through the first transmission path, a second end of the second conductive terminal extending through the insulated portion and being electrically connected to the controller through the second transmission path.

11. The assembly structure according to claim 10, wherein the first conductive terminal has ground terminals and signal terminals located between the ground terminals.

12. The assembly structure according to claim 10, wherein the frame includes a supporting bottom groove.

13. The assembly structure according to claim 10, further comprising a conductive shell surrounding the frame.

14. The assembly structure according to claim 13, further comprising a back plate connected to the conductive shell.

15. The assembly structure according to claim 10, wherein the conductive shielding layer includes a first shelter and a second shelter.

16. The assembly structure according to claim 15, wherein the first shelter is located in the frame between the first end of the first conductive terminal and the first end of the second conductive terminal.

17. The assembly structure according to claim 15, wherein the second shelter is located in the insulated portion between the second end of the first conductive terminal and the second end of the second conductive terminal.

18. The assembly structure according to claim 15, wherein the frame includes a fixing pillar located between the first inserting portion and the second inserting portion, the first shelter having an elastic fastener engaging a slot of the fixing pillar.

19. The assembly structure according to claim 15, wherein the first shelter having elastic fasteners engaging the first inserting portion and the second inserting portion.

20. The assembly structure according to claim 15, wherein the insulated portion having two holes, the second shelter having two grounding terminals, one of the two grounding terminals is inserted into each of the two holes.

* * * * *